(12) United States Patent
Carter et al.

(10) Patent No.: US 8,637,404 B2
(45) Date of Patent: Jan. 28, 2014

(54) METAL CATIONS FOR INITIATING POLISHING

(75) Inventors: Phillip W. Carter, Naperville, IL (US); Shoutian Li, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 90 days.

(21) Appl. No.: 12/952,242

(22) Filed: Nov. 23, 2010

(65) Prior Publication Data

US 2011/0065364 A1 Mar. 17, 2011

Related U.S. Application Data

(62) Division of application No. 11/526,363, filed on Sep. 25, 2006, now abandoned.

(51) Int. Cl.
*H01L 21/302* (2006.01)

(52) U.S. Cl.
USPC ............... 438/693; 438/692; 216/88; 216/89

(58) Field of Classification Search
USPC .................... 438/692, 693; 216/88, 89, 90
See application file for complete search history.

(56) References Cited

U.S. PATENT DOCUMENTS

| | | | |
|---|---|---|---|
| 4,983,650 A | 1/1991 | Sasaki | |
| 5,769,689 A | 6/1998 | Cossaboon et al. | |
| 5,858,813 A | 1/1999 | Scherber et al. | |
| 6,096,185 A * | 8/2000 | Corlett et al. | 205/742 |
| 6,350,393 B2 | 2/2002 | Francis et al. | |
| 6,468,137 B1 | 10/2002 | Fang et al. | |
| 6,607,424 B1 | 8/2003 | Costas et al. | |
| 6,632,259 B2 | 10/2003 | Weinstein et al. | |
| 6,635,186 B1 | 10/2003 | Small et al. | |
| 6,726,534 B1 * | 4/2004 | Bogush et al. | 451/36 |
| 7,820,067 B2 * | 10/2010 | Li | 252/79.1 |
| 2001/0049913 A1 | 12/2001 | Miyata | |
| 2002/0062600 A1 | 5/2002 | Mandigo et al. | |
| 2002/0132560 A1 | 9/2002 | Luo et al. | |
| 2003/0032371 A1 | 2/2003 | Weinstein et al. | |
| 2003/0082998 A1 * | 5/2003 | Carter et al. | 451/41 |
| 2004/0065020 A1 | 4/2004 | Weinstein et al. | |
| 2004/0147118 A1 | 7/2004 | Liu et al. | |
| 2005/0079709 A1 | 4/2005 | Delehanty | |
| 2005/0090104 A1 | 4/2005 | Yang et al. | |
| 2006/0030158 A1 * | 2/2006 | Carter et al. | 438/692 |
| 2007/0077865 A1 | 4/2007 | Dysard et al. | |

FOREIGN PATENT DOCUMENTS

| | | |
|---|---|---|
| WO | WO 02/020214 | 3/2002 |
| WO | WO 2004/057660 | 8/2004 |

* cited by examiner

*Primary Examiner* — Shamim Ahmed
(74) *Attorney, Agent, or Firm* — Thomas E Omholt; Steven D Weseman

(57) ABSTRACT

The invention provides methods for planarizing or polishing a metal surface. The method comprises a composition comprising an abrasive, cesium ions, and a liquid carrier comprising water.

6 Claims, 1 Drawing Sheet

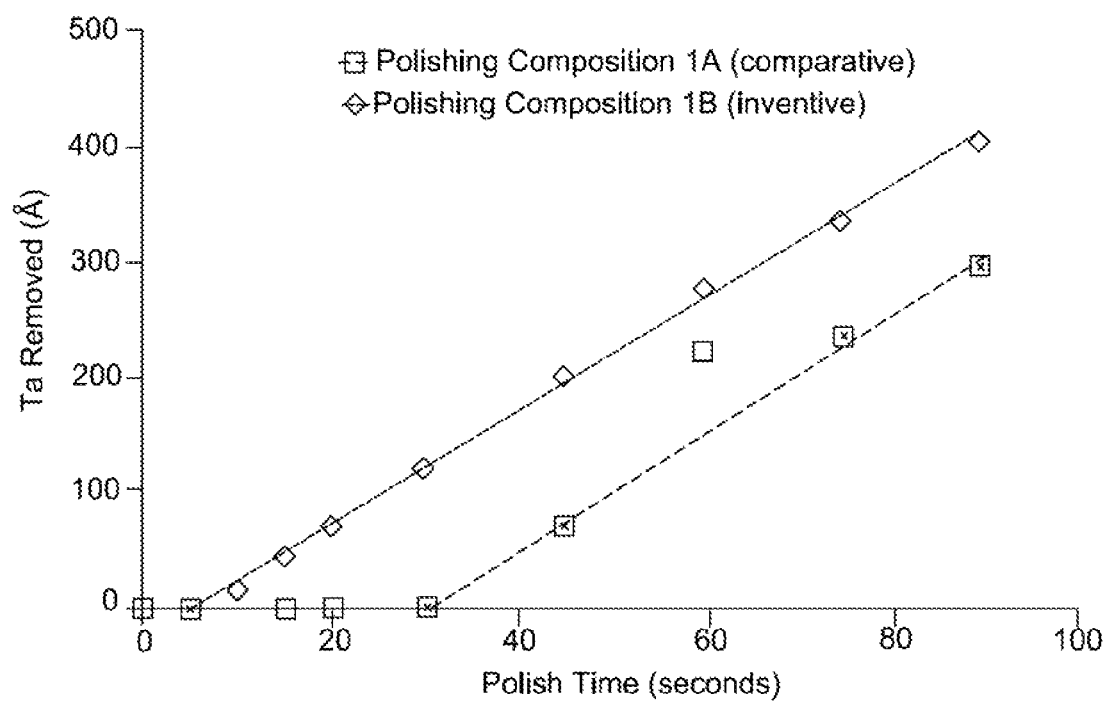

METAL CATIONS FOR INITIATING POLISHING

CROSS-REFERENCE TO RELATED PATENT APPLICATIONS

This patent application is a divisional of U.S. patent application Ser. No.11/526363, filed Sept. 25, 2006, now abandoned.

FIELD OF THE INVENTION

This invention pertains to a chemical-mechanical polishing composition and a method of polishing a substrate using the same.

BACKGROUND OF THE INVENTION

In the fabrication of integrated circuits and other electronic devices, multiple layers of conducting, semiconducting, and dielectric materials are deposited onto or removed from a substrate surface. Thin layers of conducting, semiconducting, and dielectric materials may be deposited onto the substrate surface by a number of deposition techniques. Deposition techniques common in modern microelectronics processing include physical vapor deposition (PVD), also known as sputtering, chemical vapor deposition (CVD), plasma-enhanced chemical vapor deposition (PECVD), and electrochemical plating (ECP).

As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide a level surface for subsequent levels of metallization and processing.

Chemical-mechanical planarization, or chemical-mechanical polishing (CMP), is a common technique used to planarize substrates. CMP utilizes a chemical composition, typically a slurry or other fluid medium, for selective removal of material from the substrate. In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad is moved relative to the substrate by an external driving force. The relative movement of the pad and substrate serves to abrade the surface of the substrate to remove a portion of the material from the substrate surface, thereby polishing the substrate. The polishing of the substrate by the relative movement of the pad and the substrate typically is further aided by the chemical activity of the polishing composition and/or the mechanical activity of an abrasive suspended in the polishing composition.

The ability to polish tantalum, copper, and other metal layers is hampered by the presence of a surface metal oxide layer, typically 10-50 angstroms thick depending on the deposition technique. The surface metal oxide layer has a different composition, and thus different chemical and mechanical properties, as compared to the bulk metal layer. The sacrificial metal oxide layer must be removed in order to achieve polishing of the bulk metal layer, but the chemical activity of the polishing composition and/or the mechanical activity of the abrasive may be ineffective on either the surface metal oxide layer or the bulk metal layer, leading to inefficient polishing.

Typically, polishing compositions with high solids or abrasive content quickly remove the surface metal oxide layer while polishing compositions with low solids content leave the metal oxide layer intact, yielding no bulk removal of metal. Short induction times, i.e., the time required to remove the surface metal oxide layer, are achieved with polishing compositions comprising >5 wt. % of abrasive, based on the total weight of the composition. However, high solids content can produce defects on the surface of the substrate that can negatively impact the performance of any integrated circuit layer manufactured from the substrate. Furthermore, polishing compositions containing a high solids content are less colloidally stable and are more expensive to produce.

A need therefore remains for a chemical-mechanical polishing composition that is capable of polishing a metal containing substrate with a relatively lower solids content while maintaining a short induction time for removing the surface metal oxide layer of the substrate. The invention provides such a chemical-mechanical polishing composition and related method of using the same to polish a metal substrate. These and other advantages of the invention, as well as additional inventive features, will be apparent from the description of the invention provided herein.

BRIEF SUMMARY OF THE INVENTION

The invention provides a chemical-mechanical polishing composition for polishing of a substrate, comprising (a) about 0.05 wt. % to about 2 wt. % of an abrasive, based on the total weight of the polishing composition, (b) about 0.5 to about 50 mmol/kg of cesium ions, based on the total weight of the composition, and (c) a liquid carrier comprising water. The invention further provides a method of chemically-mechanically polishing a substrate having a metal layer, comprising (a) providing a substrate, (b) contacting the substrate with a polishing pad and a chemical-mechanical polishing composition comprising: (i) about 0.05 wt. % to about 2 wt. % of an abrasive, based on the total weight of the polishing composition, (ii) about 0.5 to about 50 mmol/kg of cesium ions, based on the total weight of the polishing composition, and (iii) a liquid carrier comprising water, (c) moving the polishing pad relative to the substrate with the chemical-mechanical polishing composition therebetween, and (d) abrading at least a portion of the substrate to polish the substrate.

BRIEF DESCRIPTION OF THE DRAWINGS

The FIGURE is a graph of removal rate of tantalum from a substrate polished with an inventive composition and a comparative composition as a function of time.

DETAILED DESCRIPTION OF THE INVENTION

The invention provides a chemical-mechanical polishing composition for polishing a substrate, comprising (a) an abrasive, (b) cesium ions, and (c) a liquid carrier comprising water. The polishing composition desirably allows for lower levels of abrasive and thus lower defectivity from scratching while maintaining removal rates of the metal layer.

The polishing composition comprises cesium ions ($Cs^+$). Cesium ions are known in the art to improve polishing efficiency and defectivity in metal substrates, as disclosed in U.S.

Pat. No. 6,350,393, which is incorporated by reference. The cesium ions can be present in the polishing composition in any suitable amount. Typically, the cesium ions are present in the polishing composition in an amount of about 0.5 mmol/kg or more, and preferably about 3 mmol/kg or more, based on the total weight of the polishing composition. Typically, the cesium ions are present in the polishing composition in an amount of about 50 mmol/kg or less, and preferably about 30 mmol/kg or less, based on the total weight of the polishing composition.

The cesium ions are obtained in solution by any suitable technique, typically by dissolving in water any suitable cesium salt. Examples of cesium salts include but are not limited to cesium formate, cesium acetate, cesium hydroxide, cesium carbonate, cesium bicarbonate, cesium fluoride, cesium chloride, cesium iodide, cesium bromide, cesium nitrate, cesium perchlorate, cesium oxalate hydrate, cesium dihydrogenphosphate, cesium hydrogenphosphate and cesium sulfate. Preferred cesium salts are selected from the group consisting of cesium chloride, cesium iodide, cesium carbonate, cesium nitrate, and cesium sulfate.

The chemical-mechanical polishing composition additionally comprises an abrasive. Significantly, it has been discovered that the short induction times for the removal of sacrificial metal oxide layers can be achieved with chemical-mechanical polishing compositions comprising a relatively low solids content in the presence of cesium ions. Typically, the abrasive is present in the polishing composition in an amount of about 0.05 wt. % or more, preferably about 0.1 wt. % or more, and more preferably about 0.2 wt. % or more, based on the total weight of the polishing composition. Typically, the abrasive is present in the polishing composition in an amount of about 2 wt. % or less, preferably about 0.75 wt. % or less, and more preferably about 0.5 wt. % or less.

The abrasive can be any suitable abrasive. A desirable abrasive is a metal oxide abrasive. Preferably, the abrasive is selected from the group consisting of alumina, ceria, silica, zirconia, and mixtures thereof. Significantly, the short induction times achieved with chemical-mechanical polishing compositions comprising cesium ions with low solids content are generic for silica, alumina, ceria, and zirconia abrasives. More preferably, the abrasive is silica. The silica can be any suitable form of silica.

The abrasive can be in any suitable form. Useful forms of the abrasive include but are limited to fumed abrasives, precipitated abrasives, condensation polymerized abrasives, and colloidal abrasive particles.

A liquid carrier is used to facilitate the application of the abrasive and any components dissolved or suspended therein to the surface of a suitable substrate to be polished (e.g., planarized). The liquid carrier is typically an aqueous carrier and can be water alone (i.e. can consist of water), can consist essentially of water, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition can have any suitable pH. For example, the polishing composition can have a pH of about 8 to about 14. Typically, the polishing compositions have a pH of about 9 or greater, or more preferably about 10 or greater. The pH of the polishing composition typically is about 12 or less.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount is used to achieve and/or maintain the pH of the polishing composition within the pH ranges set forth.

The polishing composition can further comprise an oxidizing agent for at least a portion of the substrate. The oxidizing agent oxidizes a portion of the substrate to be removed by polishing. Suitable oxidizing agents include inorganic and organic per-compounds, bromates, bromites, nitrates, chlorates, chlorites, hypochlorites, chromates, iodates, iron and copper salts (e.g., nitrates, sulfates, ethylenediaminetetraacetic acid (EDTA), and citrates), rare earth and transition metal oxides (e.g., osmium tetraoxide), potassium ferricyanide, potassium dichromate, iodic acid, benzoquinones, naphthoquinones, anthraquinones, thionines, indigos, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, benzoquinones, naphthoquinones, anthraquinones, thionines, indigos, and mixtures thereof. When an oxidizing agent is present in the polishing composition, the oxidizing agent preferably comprises about 10 wt. % or less (e.g., about 5 wt. % or less, or about 2 wt. % or less, or about 1 wt % or less) of the composition. The oxidizing agent preferably comprises about 0.1 wt. % or more (e.g., about 0.25 wt. % or more, or about 0.5 wt. % or more) of the composition.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients as well as any combination of ingredients.

For example, the abrasive can be dispersed in a suitable liquid carrier. The cesium salt providing the cesium ions then can be added, and mixed by any method that is capable of incorporating the components into the polishing composition. If an oxidizing agent is desired, the oxidizing agent can be added at any time during the preparation of the polishing composition. The polishing composition can be prepared prior to use, with one or more components, such as an optional oxidizing agent, added to the polishing composition shortly before use (e.g., within about 1 minute before use, or within about 1 hour before use, or within about 7 days before use). The polishing composition also can be prepared by mixing the components at the surface of the substrate during the polishing operation.

The polishing composition can be supplied as a one package system comprising an abrasive, cesium ions, and a liquid carrier. Alternatively, the abrasive can be supplied as a dispersion in a liquid carrier in a first container, and cesium ions can be supplied in a second container as a solution in the liquid carrier. Optional components, such as an oxidizing agent, can be placed in the first and/or second containers or a third container. Furthermore, the components in the first or second container can be in dry form while the components in the corresponding container can be in the form of an aqueous dispersion. Moreover, it is suitable for the components in the first or second containers to have different pH values, or alternatively to have substantially similar, or even equal, pH values. If an optional component such as an oxidizing agent is a solid, it may be supplied either in dry form or as a mixture in the liquid carrier. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the polishing composition are within the knowledge of one of ordinary skill in the art.

The polishing composition of the invention also can be provided as a concentrate which is intended to be diluted with an appropriate amount of liquid carrier prior to use. In such an embodiment, the polishing composition concentrate can comprise the abrasive, the cesium ions and the liquid carrier in amounts such that, upon dilution of the concentrate with an appropriate amount of water, each component of the polishing composition will be present in the polishing composition in an amount within the appropriate range recited above for each component. For example, the abrasive and cesium ions can each be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component of the polishing composition. Furthermore, as will be understood by those of ordinary skill in the art, the concentrate can contain an appropriate fraction of the liquid carrier present in the final polishing composition in order to ensure that the organic acid, the corrosion inhibitor, and other suitable additives are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention further provides a method of chemically-mechanically polishing a substrate comprising (a) providing a substrate, (b) contacting the substrate with a polishing pad and a chemical-mechanical polishing composition as described herein, (c) moving the polishing pad relative to the substrate with the chemical-mechanical polishing composition therebetween, and (d) abrading at least a portion of the substrate to polish the substrate.

The substrate to be polished using the methods of the invention can be any suitable substrate containing a metal layer. Suitable substrates include, but are not limited to, integrated circuits, memory or rigid disks, metals, interlayer dielectric (ILD) devices, semiconductors, micro-electro-mechanical systems, ferroelectrics, and magnetic heads. The metal layer can comprise any suitable metal. For example, the metal layer can comprise copper, tantalum (e.g., tantalum nitride), titanium, aluminum, nickel, platinum, ruthenium, iridium, or rhodium. The substrate can further comprise at least one insulating layer. The insulating layer can be a metal oxide, porous metal oxide, glass, organic polymer, fluorinated organic polymer, or any other suitable high or low-K insulating layer. Preferably, the substrate comprises tantalum or tantalum nitride, and at least a portion of the tantalum or tantalum nitride is abraded with the polishing composition to polish the substrate.

The polishing method of the invention is particularly suited for use in conjunction with a chemical-mechanical polishing (CMP) apparatus. Typically, the apparatus comprises a platen, which, when is use, is in motion and has a velocity that results form orbital, linear, or circular motion, a polishing pad in contact with the platen and moving with the platen when in motion, and a carrier that holds a substrate to be polished by contacting and moving relative to the surface of the polishing pad. The polishing of the substrates takes place by the substrate being placed in contact with the polishing pad and the polishing composition of the invention and then the polishing pad moving relative to the substrate so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound under compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The following examples further illustrate the invention but, of course, should not be construed as in any way limiting its scope.

EXAMPLE 1

This example demonstrates the short induction time for removing tantalum oxide exhibited by the polishing composition of the invention.

Similar substrates comprising tantalum were polished using two different polishing compositions (Polishing Compositions 1A and 1B). Polishing Composition 1A (comparative) did not contain an appreciable amount of ions. Polishing Composition 1B (inventive) contained 0.25 wt. % cesium carbonate. Each of the aforementioned polishing compositions also comprised about 0.25 wt. % zirconia and about 0.25 wt. % potassium iodate, and had a pH of about 11.

The polishing experiments generally involved the use of a commercially available polishing apparatus equipped with a polishing pad, and the polishing parameters were the same for all polishing experiments. The values for the tantalum removal rate (in Angstroms per minute) were measured for each of the polishing compositions. The results are summarized in Table 1.

TABLE 1

Tantalum removed as a function of time

| Polishing Composition | Monovalent Cation | Induction Time (sec) | Tantalum Removal Rate (Å/sec) |
|---|---|---|---|
| 1A (comparative) | — | 30 | 4.82 |
| 1B (inventive) | cesium | 4-6 | 4.95 |

The data of Table 1 is plotted in the graph of the FIGURE, which depicts the tantalum removal rate as a function of time. These results demonstrate that the polishing composition of the invention exhibits a short induction time for the removal of the surface tantalum oxide layer as compared to a similar low solids content polishing composition comprising no appreciable amount of cesium ions. Moreover, the similar slopes of the depicted curves of the FIGURE show that Polishing Compositions 1A and 1B exhibit similar removal rates of bulk tantalum, and that the presence of cesium ions has little influence on the bulk tantalum removal rate.

EXAMPLE 2

This example demonstrates the effects of ion type on tantalum removal with polishing compositions comprising low solids content.

Similar substrates comprising tantalum were polished using 17 different polishing compositions (Polishing Compositions 2A, 2B, 2C, 2D, 2E, 2F, 2G, 2H, 2I, 2J, 2K, 2L, 2M, 2N, 2O, 2P, and 2Q). Polishing compositions 2A-2E (comparative) comprised about 12 mmol/kg of potassium ions (as potassium chloride, iodide, nitrate, carbonate, and sulfate, respectively). Polishing compositions 2F-2J (inventive) comprised about 12 mmol/kg of cesiums ions (as cesium chloride, iodide, nitrate, carbonate, and sulfate, respectively). Polishing compositions 2K-2M (comparative) comprised about 12 mmol/kg of sodium ions (as sodium chloride, iodide, and carbonate, respectively). Polishing composition 2N (comparative) comprised about 12 mmol/kg of tetramethylammonium iodide. Polishing composition 2O (comparative) comprised about 12 mmol/kg of tetraethylammonium chloride. Polishing composition 2P (comparative) comprised about 12 mmol/kg of tetrabutylammonium chloride. Polishing composition 2Q (comparative) did not contain an appreciable amount of ions. Each the aforementioned polishing compositions also comprised about 0.5 wt. % fumed silica and about 0.10 wt. % anthraquinonedisulfonic acid (AQDSA), and had a pH of about 10.

The polishing experiments generally involved the use of a commercially available polishing apparatus equipped with a polishing pad, and the polishing parameters, including the polishing time of about 1 minute, were the same for all polishing experiments. The values for the tantalum removal rate (in Angstroms per minute) were measured for each of the polishing compositions. The results are summarized in Table 2.

TABLE 2

Tantalum removal rates

| Polishing Composition | Monovalent Cation | Counterion | Concentration of Monovalent Cation (mmoles/kg) | Tantalum Removal Rate (Å/min) |
|---|---|---|---|---|
| 2A (comparative) | potassium | chloride | 12 mmol/kg | 28 |
| 2B (comparative) | potassium | iodide | 12 mmol/kg | 11 |

TABLE 2-continued

Tantalum removal rates

| Polishing Composition | Monovalent Cation | Counterion | Concentration of Monovalent Cation (mmoles/kg) | Tantalum Removal Rate (Å/min) |
|---|---|---|---|---|
| 2C (comparative) | potassium | nitrate | 12 mmol/kg | 13 |
| 2D (comparative) | potassium | carbonate | 12 mmol/kg | 18 |
| 2E (comparative) | potassium | sulfate | 12 mmol/kg | 16 |
| 2F (inventive) | cesium | chloride | 12 mmol/kg | 315 |
| 2G (inventive) | cesium | iodide | 12 mmol/kg | 360 |
| 2H (inventive) | cesium | nitrate | 12 mmol/kg | 327 |
| 2I (inventive) | cesium | carbonate | 12 mmol/kg | 356 |
| 2J (inventive) | cesium | sulfate | 12 mmol/kg | 193 |
| 2K (comparative) | sodium | chloride | 12 mmol/kg | 14 |
| 2L (comparative) | sodium | iodide | 12 mmol/kg | 12 |
| 2M (comparative) | sodium | carbonate | 12 mmol/kg | 14 |
| 2N (comparative) | tetramethyl-ammonium | iodide | 12 mmol/kg | 8 |
| 2O (comparative) | tetraethyl-ammonium | chloride | 12 mmol/kg | 8 |
| 2P (comparative) | tetrabutyl-ammonium | chloride | 12 mmol/kg | 7 |
| 2Q (comparative) | — | — | — | 9 |

These results demonstrate that the polishing composition of the invention exhibits a high tantalum removal rate as compared to similar low solids content polishing compositions comprising ions other than cesium or comprising no appreciable amount of ions. Polishing Compositions 2A-2E and 2K-2Q (comparative) were ineffective in removing the surface tantalum oxide layer, which is typically 10-50 Angstroms, in about 1 minute of polishing. In comparison, the results show that Polishing Compositions 2F-2J (inventive) removed the surface tantalum oxide layer and a significant amount of bulk tantalum in about 1 minute of polishing.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. The method of chemically-mechanically polishing a substrate comprising tantalum, comprising:
    (a) providing a substrate,
    (b) contacting thesubstrate with a polishing pad and a chemical-mechanical polishing composition comprising:
        (i) about 0.05 wt. % to about 0.75 wt. % of silica abrasive, based on the total weight of the polishing composition,
        (ii) about 0.5 to about 50 mmol/kg of cesium ions, based on the total weight of the polishing composition, and
        (iii) a liquid carrier comprising water, wherein the composition has a pH of about 8 to about 14, and wherein the composition further comprises an oxidizing agent selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organohalo-oxy compounds, periodates, permanganate, peroxyacetic acid, benzoquinones, naphthoquinones, anthraquinones, thionines, indigos, and mixtures thereof,
    (c) moving the polishing pad relative to the substrate with the chemical-mechanical polishing composition therebetween, and
    (d) abrading at least a portion of the tantalum from the substrate to polish the substrate.

2. The method of claim 1, wherein the cesium ions are present in an amount of about 3 mmol/kg to about 30 mmol/kg, based on the total weight of the polishing composition.

3. The method of claim 1, wherein the cesium ions are obtained by dissolution in the water of a compound selected from the group consisting of cesium chloride, cesium iodide, cesium carbonate, cesium nitrate, and cesium sulfate.

4. The method of claim 1, wherein the silica abrasive is present in an amount of about 0.1 wt. % to about 0.75 wt. %, based on the total weight of the polishing composition.

5. The method of claim 4, wherein the silica abrasive is present in an amount of about 0.2 wt. % to about 0.5 wt. %, based on the total weight of the polishing composition.

6. The method of claim 1, wherein the silica composition has a pH of about 9 to about 12.

* * * * *